United States Patent [19]

Everest

[11] 4,132,902

[45] Jan. 2, 1979

[54] SWITCH

[75] Inventor: Charles E. Everest, Santa Ana, Calif.

[73] Assignee: Telatemp Corporation, Fullerton, Calif.

[21] Appl. No.: 710,150

[22] Filed: Jul. 30, 1976

[51] Int. Cl.² ............................................. H01H 35/00
[52] U.S. Cl. ............................... 307/116; 200/DIG. 1; 361/181
[58] Field of Search ......... 307/116; 200/157, DIG. 1, 200/DIG. 2; 361/179, 181

[56] References Cited

U.S. PATENT DOCUMENTS

| 3,492,542 | 1/1970 | Atkins | 361/181 |
| 3,641,410 | 2/1972 | Vogelsberg | 200/157 |
| 3,737,670 | 6/1973 | Larson | 307/116 |
| 3,947,696 | 3/1976 | Larson et al. | 200/DIG. 2 |

FOREIGN PATENT DOCUMENTS 343997  11/1921  Fed. Rep. of Germany .... 200/DIG. 2

OTHER PUBLICATIONS

Johnson, IBM Technical Disclosure Bulletin, vol. 13, No. 11, Apr. 1971, p. 3551 (Pushbutton switch with no moving parts).

Primary Examiner—Robert K. Schaefer
Assistant Examiner—M. K. Mutter
Attorney, Agent, or Firm—Edward D. O'Brian

[57] ABSTRACT

An electrically powered instrument having a handle which is adapted to be engaged by the hand of a user during the utilization of the instrument can include a switch-type structure which is actuated by the mere engagement of the hand with the handle without any physical or mechanical motion occurring. The switch includes electrodes extending along the handle which are electrically insulated from one another and which are located in such a manner that they are electrically connected through the user's hand when the hand engages the handle. The switch also includes a power source or supply for applying a voltage between the electrodes and a discriminating or detection structure for detecting the change in the electrical resistance between the electrodes occurring either when the handle is engaged by the hand of the user or when the handle is released by the hand of the user. The discriminating or detection structure serves to "release" power so as to operate to turn on the instrument when the electrodes are connected by the hand of the user.

5 Claims, 4 Drawing Figures

SWITCH

CROSS REFERENCE TO RELATED APPLICATIONS

None.

BACKGROUND OF THE INVENTION

The invention set forth in this specification pertains to a new and improved switch. More specifically it pertains to what may be referred to as an electrical or electronic switch which does not employ any physically moving parts and which is adapted to be turned on and off through engagement with the hand of a user.

The invention is primarily intended to be utilized in turning on and off various types of electrically powered instruments having handles which are adapted to be engaged by the hand of the user during utilization of the instrument. Such instruments may be constructed and utilized for a wide variety of different, diverse purposes. Such instruments may utilize internal batteries in order to obtain electric power or may be connected to an appropriate power source through the use of a conventional electric cord. Normally such instruments include a conventional type of switch which has to be actuated in order to turn the instrument on or off.

It has been recognized that the utilization of such switches in hand held electrically powered instruments is relatively disadvantageous. One reason for this pertains to the usual reliability problems associated with conventional switches employing mechanical movement. The use of such switches in instruments as described is also relatively disadvantageous because of the possibility that the user of an instrument may forget to or may neglect to turn the switch on such an instrument off when the instrument itself is not being utilized.

The recognition of the latter has led to the development of various instruments in which the switch is located so that when the instrument is removed from the hand the switch will automatically move to an off position. It is also known to construct instruments as described with a trigger mechanism utilized in conjunction with the handle of an instrument operatively connected to a switch so that the instrument may be turned on and off through the actuation of the trigger mechanism. While utilitarian expedients of these types are disadvantageous because of the reliability problems associated with any mechanical switch as briefly noted in the preceding.

Frequently the inclusion of a switch actuated by a trigger mechanism in an instrument as noted is disadvantageous for another reason. Frequently it is necessary or desirable to utilize a trigger in such an instrument to control the operation and/or utilization of the instrument in other than an on/off type manner. In general, the use of a multifunction trigger mechanism to accomplish switch actuation and to accomplish another control function tends to make an instrument unnecessarily complex. This in turn tends to affect instrument costs and reliability.

In the past it has been proposed to avoid the reliability problems associated with mechanical switches and to avoid the possibility of an instrument being laid aside while remaining turned on through the use of various types of proximity switches. While expedients of this type are also considered to be utilitarian they are also considered to be relatively undesirable. This is because an instrument as noted may be laid down upon a table or work bench or the like in such a manner that any proximity switch mechanism within the instrument is sufficiently close to one or more objects so as to be actuated by such objects. This, of course, will have the effect of leaving the instrument on when the instrument itself is not in use.

SUMMARY OF THE INVENTION

A broad object of the present invention is to provide within hand held instruments new and improved switches which are desirable in that they are not of a mechanical character, in that they are capable of being automatically turned off or on in accordance with whether or not the handle of the instrument is engaged by the hand of the user and in that they permit the use of a trigger on the instrument for controlling an aspect of the instrument's control without the switch being associated with or connected to the trigger.

All of these factors are considered to relate to the commercial desirability and/or acceptability of a switch in accordance with this invention. The invention is also intended to provide new and improved switches which may be easily and conveniently constructed at a comparatively nominal cost, which may be easily and conveniently utilized with a minimum of difficulty, and which are capable of satisfactorily operating over prolonged periods with a minimum of difficulty. In accordance with this invention these various objections are achieved by providing an electrically powered instrument having a handle adapted to be engaged by the hand of a user during the utilization of the instrument and a switch for turning the instrument on and off in which the improvement comprises: the switch including spaced electrodes extending along the handle, these electrodes being electrically insulated from one another in such a manner that they can be electrically connected to one another through the hand of the user when the handle is engaged by the hand of the user, the switch also including power supply means for applying a voltage between the electrodes, the supply means being connected to the electrodes, the switch further including discriminating means for detecting a change in the electrical resistance between the electrodes occurring either when the handle is engaged by the hand of the user or when the handle is released from the hand of the user and for releasing power to operate the instrument when the electrodes are connected by the hand of the user, said discriminating means being connected to at least one of said electrodes.

BRIEF DESCRIPTION OF THE DRAWING

Because of the nature of this invention it is considered that it and various features of it which are considered to be of significance are best described with reference to the accompanying drawing in which.

Figure 1:
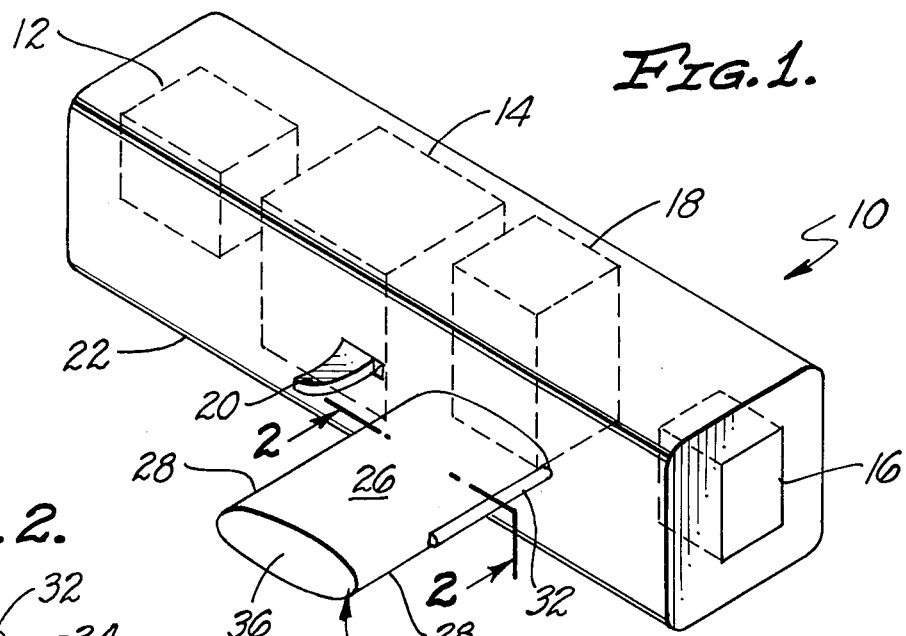
FIG. 1 is an isometric view showing a hand held electrically powered instrument constructed in accordance with this invention.
Figure 2:
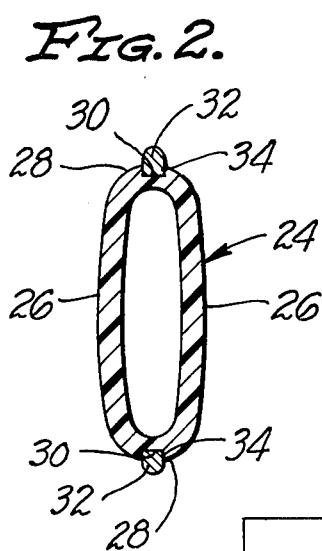
FIG. 2 is a diagrammatic type cross-sectional view in which only the front and rear edges of the handle of the instrument and part of the exterior of the handle of the instrument are illustrated, this view corresponding to a view taken at line 2—2 of FIG. 1.

It is to be understood that the invention involves certain operative concepts or principles as are set forth and defined in the appended claims forming a part of the disclosure of this specification. While these concepts or principles are embodied within the instrument and the circuits illustrated in the drawing they can also be embodied within other somewhat differently constructed and differently appearing instruments and within other somewhat different circuits through the use or exercise of routine engineering skill.

DETAILED DESCRIPTION

In the drawing there is shown an instrument 10 of a type utilized for measuring or monitoring temperature. This instrument 10 includes a known sensing element 12, what may be referred to as an "electronic package" 14 connected to the sensing element 12 and a display 16 connected to the package 14 so as to be operated by it. Batteries 18 are located within the instrument 10 for the purpose of serving as a power source to operate the package 14 and the display 16. A trigger 20 is movably mounted in a conventional manner in the instrument 10 for the purpose of controlling or governing an aspect of the operation of this instrument 10 other than turning the instrument 10 on or off. It is not considered necessary to more fully describe the sensing element 12, the electronic package 14, the display 16, and the trigger 20 in this specification since none of these items form a part of this invention and since elements corresponding to them are known. These various elements have been set forth herein merely to facilitate a complete understanding of one utilization of the invention.

The instrument 10 described includes an elongated "barrel-like" housing 22 which supports the various parts or elements designated by the numerals 12, 14, 16, 18 and 20 in the preceding. This housing 22 carries a handle 24 used to support the instrument 10 as it is used located in proximity to the trigger 20 which is adapted to be utilized in supporting and holding the complete instrument 10 as this instrument 10 is used. In accordance with this invention this handle 24 is provided with an electrically nonconductive exterior "shell" (not separately numbered) consisting of sides 26 and front and rear edges or ends 28. Each of these ends 28 is provided with a groove 30 extending generally along the center of the front and rear ends 28.

Elongated electrodes 32 formed of a relatively inert material are secured in place within these grooves 30 in any conventional, convenient manner, such as, for example, through the use of an adhesive 34 so that these electrodes 32 extend from the ends 28 to a sufficient extent so that they will be engaged by the hand of a user when the instrument 10 is employed. The electrodes 32 extend into the housing 22 and are connected to components as described in a conventional manner. It will be noted that these electrodes 32 are, with this construction, located so as to be spaced from one another and so as to be electrically insulated from one another.

Further, they are located on the handle 24 in such a manner that there is no way that the electrodes 32 can be connected when the instrument 10 is laid down upon a flat supporting surface (not shown) such as, for example, a table. This is considered important with the invention in preventing the possibility of the instrument 10 being laid down upon a damp support surface (not shown) which might tend to electrically connect the electrodes 32. In order to achieve this result it is considered preferable that the housing 22 be of sufficient width and dimension so that the handle 24 will not come in contact with any support surface (not shown) or so that only the butt or butt end 36 of the handle 24 remote from the housing 22 will come in contact with the support surface (not shown) when the instrument 10 is laid down.

Preferably, the electrodes 32 are located so as to be spaced from the end 36 in order to avoid their being electrically connected by a support surface (not shown) if the handle 24 should be brought in contact with such a surface during utilization of the instrument 10. These electrodes 32 are also preferably located as shown so that the handle 24 may be engaged in a normal manner by the hand of a user. During such engagement one of the electrodes 32 will engage roughly the palm of the hand while the other of the electrodes 32 will be contacted by one or more fingers of the hand. Because of the normal presence of comparatively small amounts of moisture, salt, etc., in the human skin and flesh such contact will change the electrical resistance between the two electrodes 32.

Figure 3:
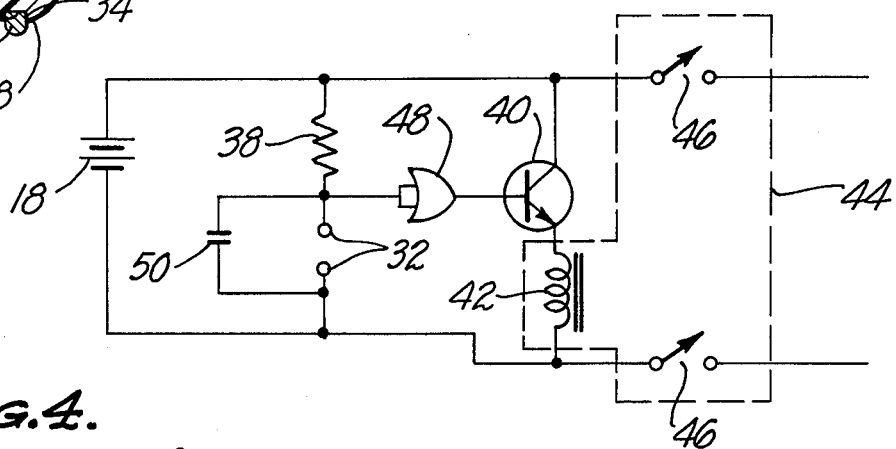
FIG. 3 is a circuit diagram illustrating a presently preferred switch circuit as employed in the instrument illustrated in the preceding figures.

In accordance with this invention these electrodes 32 are preferably connected in a circuit as indicated in FIG. 3 of the drawing. This circuit is a type of resistance discrimination circuit utilizing a simple voltage divider type action. In this circuit one terminal of the battery 18 previously described is directly connected to one of the electrodes 32 and the other terminal of the battery 18 is connected to the other of the electrodes 32 through a resistor 38. This battery 18 is also utilized to supply power to a transistor 40 connected in series with a coil 42 of a conventional relay 44. This relay 44 includes switch contacts 46 which are adapted to be closed when current flows to the coil 42 in order to supply power from the battery 18 to the electronic package 14 so as to turn the instrument 10 on so that this instrument 10 can be operated.

A conventional logic element 48 such as any one of a wide variety of known complementary metal oxide semiconductor logic elements is preferably connected to the base of the transistor 40 and to the one of the electrodes 32 connected to the resistor 38. It is not considered necessary to specifically describe all of the known logic elements which can be utilized as the element 48 since such elements are well known. Various different such elements such as are known as nand gates, nor gates, and gates, or gates, logic inverters, buffers, and the like can be used. All of such elements are known to be capable of being utilized as voltage discriminator amplifiers in accordance with this invention in order to detect a voltage change corresponding to the change occurring when the hand of an individual is brought into engagement with or is removed from the electrodes 32. Such logic elements are considered to be comparatively economical. The characteristics of such elements are considered to be so well known that it is not considered necessary to specifically describe them in this specification. They have such a relatively low standby current consumption in either of two stable output voltage states that they are quite desirable with the invention. A small bypass or buffer capacitor 50 is preferably utilized across the electrodes 32.

It is considered that the operation of this circuit in FIG. 3 will be essentially self-evident to anyone reasonably familiar with electronics. When the electrodes 32 are initially connected by the hand of a user the conductivity of the hand will, of course, result in a variation of the voltage between the electrodes 32. As this occurs there will be a tendency for the capacitor 50 to be discharged. This capacitor 50 will also tend to act thereafter as a filter to minimize the effects of the manner in which the electrodes 32 are contacted by a hand such as, for example, when there are variations of the manner in which the electrodes 32 are engaged. The capacitor 50 will also thereafter tend to act as a filter in the case of extraneous body signals affecting the voltage difference between the electrodes 32. In a sense this capacitor 50 is merely an adjunct which is secondary to the principal voltage change occurring between the electrodes 32 as the handle 24 is engaged. This change in voltage operates to change the output voltage state of the logic element 48 so as to cause an output to the transistor 40 which will turn this transistor 40 on. As this occurs current will flow through the coil 42 and this in turn will cause the contacts 46 to close. This will have the effect of turning the instrument 10 on.

When the instrument 10 is laid down after being used the handle 24 will no longer be engaged. As it is disengaged the electrodes 32 will no longer be connected through the hand and the voltage across these electrodes 32 will change back to the voltage prior to the electrodes 32 being connected by the hand. The logic element 48 will detect this voltage change and will then change to its other output state so as to turn off the transistor 40. At this point power will no longer be "released" through the transistor 40 and the relay 44 will automatically operate so that the contacts 46 will automatically open. This, of course, will have the effect of shutting off the instrument 10.

Figure 4:
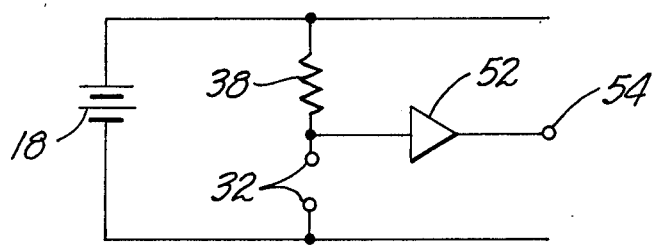
FIG. 4 is a circuit diagram indicating a modified switch circuit which may be employed with the invention.

It will be realized from the preceding that the logic element 48 is employed as a discriminating or detecting means or structure in order to provide an output in accordance with the voltage drop across the electrodes 32. Many other such structures can be utilized. For example, it is possible to utilize a circuit as indicated in FIG. 4 in which a conventional operational amplifier 52 is connected as shown across the battery 18 so that one of its inputs is connected to the one of the electrodes 32 connected to the resistor 38. With this type of structure the other of the inputs of the amplifier 52 is connected to a voltage reference source (not shown). In this case an output is provided at a terminal 54 which is employed in a conventional manner in turning an instrument 10 on when the electrodes 32 are connected to the hand of the user. No such output is, of course, provided with this structure when such electrodes 32 are no longer so connected.

I claim:

1. An electrically powered instrument having an electrically non-conductive handle adapted to be engaged by the hand of a user during the utilization of said instrument and a switch for turning said instrument on and off in which the improvement comprises:

said switch including spaced electrically conductive electrodes, said electrodes being electrically insulated from one another by said handle, said electrodes being located on the front and rear edges of said handle remote from one another in positions in which one of said electrodes will be engaged by the palm of the hand and the other of said electrodes will be engaged by one or more fingers of the hand as said handle is held by the hand of the user, said instrument being shaped so that when laid upon a flat surface said electrodes cannot contact said surface, said switch also including power supply means for applying a voltge between said electrodes, said supply means being connected to said electrodes, said switch further including discriminating means for detecting a change in the electrical resistance between said electrodes occurring either when said handle is engaged by the hand of the user or when said handle is released from the hand of the user and for releasing power to operate said instrument when said electrodes are connected to the hand of the user, said discriminating means being connected to at least one of said electrodes.

2. An instrument as claimed in claim 1 wherein:
   said electrodes extend from said edges.

3. An instrument as claimed in claim 2 wherein:
   said handle extends from the remainder of said instrument and is capable of being utilized in supporting said instrument,
   said electrodes are spaced from the butt of said handle remote from the remainder of said instrument.

4. An instrument as claimed in claim 1 wherein:
   said electrodes are located on the front and rear edges of said handle remote from one another in positions in which one of said electrodes will be engaged by the palm of the hand and the other of said electrodes will be engaged by one or more fingers of the hand as said handle is held by the hand of the user,
   said electrodes extend from said edges,
   said handle extends from the remainder of said instrument and is capable of being utilized in supporting said instrument,
   said electrodes are spaced from the butt of said handle remote from the remainder of said instrument,
   said discriminating means includes a voltage discriminator amplifier means and relay means for opening and closing a circuit, said relay means being connected to said voltage discriminator amplifier means so as to be capable of being opened and closed in response to the operation of said voltage discriminator amplifier,
   said voltage discriminator amplifier means comprises a complementary metal oxide semiconductor logic element.

5. An instrument as claimed in claim 1 wherein:
   said electrodes are located on the front and rear edges of said handle remote from one another in positions in which one of said electrodes will be engaged by the palm of the hand and the other of said electrodes will be engaged by one or more fingers of the hand as said handle is held by the hand of the user,
   said electrodes extend from said edges,
   said handle extends from the remainder of said instrument and is capable of being utilized in supporting said instrument,
   said electrodes are spaced from the butt of said handle remote from the remainder of said instrument;
   said discriminating means comprises an operational amplifier.

* * * * *